United States Patent
Yun (10) Patent No.: US 10,056,125 B2
(45) Date of Patent: Aug. 21, 2018

(54) DATA STORAGE DEVICE AND OPERATING METHOD THEREOF

(71) Applicant: SK hynix Inc., Gyeonggi-do (KR)

(72) Inventor: Ho Jung Yun, Seoul (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 15/484,923

(22) Filed: Apr. 11, 2017

(65) Prior Publication Data
US 2018/0174628 A1    Jun. 21, 2018

(30) Foreign Application Priority Data

Dec. 16, 2016  (KR) .................. 10-2016-0172570

(51) Int. Cl.
*G11C 7/10*    (2006.01)
*G11C 7/22*    (2006.01)
*G11C 29/02*   (2006.01)

(52) U.S. Cl.
CPC .............. *G11C 7/222* (2013.01); *G11C 7/10* (2013.01); *G11C 29/023* (2013.01)

(58) Field of Classification Search
CPC .......... G11C 7/222; G11C 7/10; G11C 29/023
See application file for complete search history.

(56) References Cited

U.S. PATENT DOCUMENTS

| | | | | |
|---|---|---|---|---|
| 2008/0205170 | A1* | 8/2008 | Ikeda ................ | G11C 29/02 365/193 |
| 2009/0244997 | A1* | 10/2009 | Searles .............. | G11C 7/1051 365/194 |
| 2013/0070544 | A1* | 3/2013 | Nishiwaki ......... | G11C 7/1066 365/193 |
| 2015/0194196 | A1* | 7/2015 | Huang ................ | G11C 7/1072 711/105 |
| 2015/0278151 | A1 | 10/2015 | Tang | |
| 2016/0189758 | A1* | 6/2016 | Desireddi .......... | G11O 5/063 365/193 |

* cited by examiner

*Primary Examiner* — Toan Le
(74) *Attorney, Agent, or Firm* — IP & T Group LLP (57) ABSTRACT

A data storage device includes a memory device suitable for storing and outputting data in synchronization with a strobe signal; and a controller suitable for delaying the strobe signal based on each of different test delay values, testing capture of the data by using a delayed strobe signal, and determining a delay value of the strobe signal based on a test result.

20 Claims, 7 Drawing Sheets

|        | MEM1 | MEM2 | MEM3 | MEM4 |
|--------|------|------|------|------|
| TVAL1  | O    | X    | X    | O    |
| TVAL2  | O    | X    | O    | O    |
| TVAL3  | O    | O    | O    | O    |
| TVAL4  | O    | O    | O    | O    | → VAL
| TVAL5  | O    | O    | O    | O    |
| TVAL6  | X    | O    | O    | X    |
| TVAL7  | X    | O    | X    | X    |
| TVAL8  | X    | X    | X    | X    |
| TVAL9  | X    | X    | X    | X    |
| TVAL10 | X    | X    | X    | X    |

Capture success : O
Capture failure : X

DATA STORAGE DEVICE AND OPERATING METHOD THEREOF

CROSS-REFERENCES TO RELATED APPLICATION

The present application claims priority under 35 U.S.C. § 119(a) to Korean application number 10-2016-0172570, filed on Dec. 16, 2016, in the Korean Intellectual Property Office, which is incorporated herein by reference in its entirety.

BACKGROUND

1. Technical Field

Various embodiments generally relate to a data storage device, and, more particularly, to a data storage device including a memory device.

2. Related Art

Data storage devices store data provided by an external device in response to a write request. Data storage devices may also provide stored data to an external device in response to a read request. Examples of external devices that use data storage devices include computers, digital cameras, cellular phones and the like. Data storage devices may be embedded in an external device during manufacturing of the external devices or may be fabricated separately and then connected afterwards to an external device.

SUMMARY

In an embodiment, a data storage device may include: a memory device suitable for storing and outputting data in synchronization with a strobe signal; and a controller suitable for delaying the strobe signal based on each of different test delay values, testing capture of the data by using a delayed strobe signal, and determining a delay value of the strobe signal based on a test result.

In an embodiment, a method for operating a data storage device may include: storing data and a strobe signal received from a memory device; delaying the strobe signal based on each of different test delay values, and testing capture of the data by using a delayed strobe signal; and determining a delay value of the strobe signal based on a test result.

In an embodiment, a controller for a data storage device may include: a test unit suitable for receiving data in synchronization with a strobe signal from a memory device, delaying the strobe signal based on each of different test delay values, testing capture of the data by using a delayed strobe signal; and a delay value calculator suitable for determining a delay value of the strobe signal based on a test result.

BRIEF DESCRIPTION OF THE DRAWINGS

The above and other features and advantages of the present invention will become more apparent to those skilled in the art to which the present invention belongs by describing various embodiments thereof with reference to the attached drawings in which.

DETAILED DESCRIPTION

Hereinafter, various embodiments of the present invention including a data storage device and an operating method thereof will be described with reference to the accompanying drawings. We note, however, that the present invention may be embodied in different forms and should not be construed as being limited to the embodiments set forth herein. Rather, these embodiments are provided to describe the present invention in detail to the extent that a person skilled in the art to which the invention pertains could practice the technical concepts of the present invention.

It is to be understood that embodiments of the present invention are not limited to the particulars shown in the drawings, that the drawings are not necessarily to scale, and, in some instances, proportions may have been exaggerated in order to more clearly depict certain features of the invention. While particular terminology is used, it is to be appreciated that the terminology used is for describing particular embodiments only and is not intended to limit the scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The phrase "at least one of . . . and . . . ," when used herein with a list of items, means a single item from the list or any combination of items in the list. For example, "at least one of A, B, and C" means, only A, or only B, or only C, or any combination of A, B, and C.

The term "or" as used herein means either one of two or more alternatives but not both nor any combinations thereof.

As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element also referred to as a feature described in connection with one embodiment may be used singly or in combination with other elements of another embodiment, unless specifically indicated otherwise.

Hereinafter, the various embodiments of the present invention will be described in detail with reference to the attached drawings.

Figure 1:
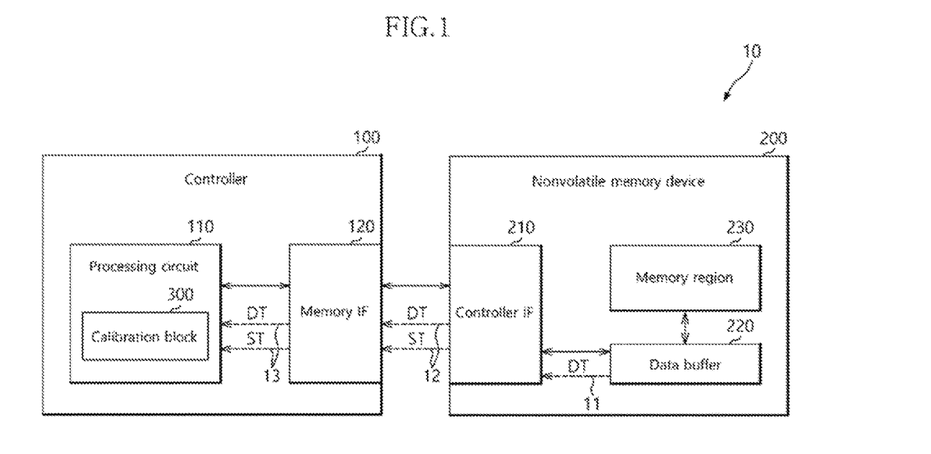
FIG. 1 is a block diagram illustrating a data storage device in accordance with an embodiment of the present invention.

FIG. 1 is a block diagram illustrating a data storage device 10 in accordance with an embodiment of the present invention.

The data storage device 10 may be configured to store data provided from an external device, in response to a write request from the external device. Also, the data storage device 10 may be configured to provide stored data to the external device, in response to a read request from the external device.

The data storage device 10 may be configured as a Personal Computer Memory Card International Association (PCMCIA) card, a Compact Flash (CF) card, a smart media card, a memory stick, various multimedia cards (e.g., MMC, eMMC, RS-MMC, and MMC-Micro), various secure digital cards (e.g., SD, Mini-SD, and Micro-SD), a Universal Flash Storage (UFS), a Solid State Drive (SSD) and the like.

The data storage device 10 may include a controller 100 and at least one nonvolatile memory device 200.

The controller 100 may include a processing circuit 110 and a memory interface (IF) 120.

The processing circuit 110 may control the write and read operations of the nonvolatile memory device 200. The processing circuit 110 may process signals to be transmitted and received to and from the nonvolatile memory device 200 through the memory interface 120. For example, the processing circuit 110 may receive data DT and a strobe signal ST from the memory interface 120. The data DT may be synchronized with the strobe signal ST. The processing circuit may also capture the data DT by using the strobe signal ST, and may process the captured data.

The processing circuit 110 may include a calibration block 300. The calibration block 300 may calculate a delay value of the strobe signal ST, in order to minimize the occurrence of skew in the data DT and the strobe signal ST through the data read paths 11, 12 and 13. The data read paths 11, 12 and 13 provide a data path linking the data buffer 220 of the nonvolatile memory device 200 with the processing circuit 110 via the controller 210 and memory interfaces 120. The processing circuit 110 may control the timing of the strobe signal ST by applying the delay value calculated by the calibration block 300 to the strobe signal ST, and capture precisely the data DT by using the time-controlled strobe signal ST.

In an embodiment, the calibration block 300 may delay the strobe signal ST based on each of different test delay values, test capture the data DT using delayed strobe signals, and calculate the delay value of the strobe signal ST based on a test result. The calibration block 300 may store the data DT and the strobe signal ST received from the nonvolatile memory device 200 through the memory interface 120 and may perform a calibration operation using the stored data and strobe signals, hence, it is not necessary to request the read operation of the nonvolatile memory device 200 a multitude of times. Therefore, the calibration operation may be performed faster. Also, the calibration operation is not subject to errors which may be otherwise added to the data read paths 11 to 13 which depend on external circumstances while the calibration operation is performed. As a result, it is possible to calculate a more precise delay value.

For the calibration operation, the calibration block 300 may store test data (not shown) in the nonvolatile memory device 200, and control the nonvolatile memory device 200 to output the stored test data DT in synchronization with the strobe signal ST. In this regard, the calibration block 300 may control the nonvolatile memory device 200 to store the test data only in the data buffer 220. Hence, the calibration block 300 controls the nonvolatile memory device 200 not to store any test data in a memory region 230. This is advantageous because it may prevent an error due to the degradation of the physical characteristics of the memory cells included in the memory region 230.

Also, for further increasing the precision of the calibration operation, the calibration block 300 may transmit test data DT to the controller interface (IF) 210 in a single data rate (SDR) mode, and receive the data DT and the strobe signal ST from the controller interface 210 in a double data rate (DDR) mode.

The memory interface 120 may communicate with the controller interface 210 of the nonvolatile memory device 200 via one or more suitable communication protocols. The memory interface 120 may transmit the data DT and the strobe signal ST received from the controller interface 210, to the calibration block 300 for the calibration operation.

The nonvolatile memory device 200 may perform a write operation and a read operation for the memory region 230 according to control of the controller 100. The nonvolatile memory device 200 may include a flash memory, such as a NAND flash or a NOR flash, a Ferroelectrics Random Access Memory (FeRAM), a Phase-Change Random Access Memory (PCRAM), a Magnetoresistive Random Access Memory (MRAM), a Resistive Random Access Memory (ReRAM), and the like.

The nonvolatile memory device 200 may include the controller interface 210, the data buffer 220, and the memory region 230.

The controller interface 210 may communicate with the memory interface 120 of the controller 100. The controller interface 210 may transmit the data DT received from the data buffer 220, to the memory interface 120 in synchronization with the strobe signal ST. The controller interface 210 may transmit the data received from the memory interface 120, for example, data to be stored in the memory region 230 or test data for the calibration operation, to the data buffer 220.

The data buffer 220 may be a volatile device. The data buffer 220 may temporarily store data to be written or read in or from the memory region 230, between the memory region 230 and the controller interface 210. As described above, test data for the calibration operation are not stored in the memory region 230, but may be stored only in the data buffer 220.

The memory region 230 may store data (other than test data) received from the data buffer 220. The nonvolatile memory device 200 may include a plurality of memory cells capable of storing data. The memory cells may be single-bit or multi-bit memory cells. The memory cells of the memory region may be arranged in a two- or three-dimensional structure. In a preferred embodiment, the memory cells of the memory region 230 may be multi bit cells arranged in a three-dimensional structure.

While FIG. 1 illustrates only one nonvolatile memory device 200, it is to be noted that, according to an embodiment, the data storage device 10 may include a plurality of nonvolatile memory devices.

Figure 2:
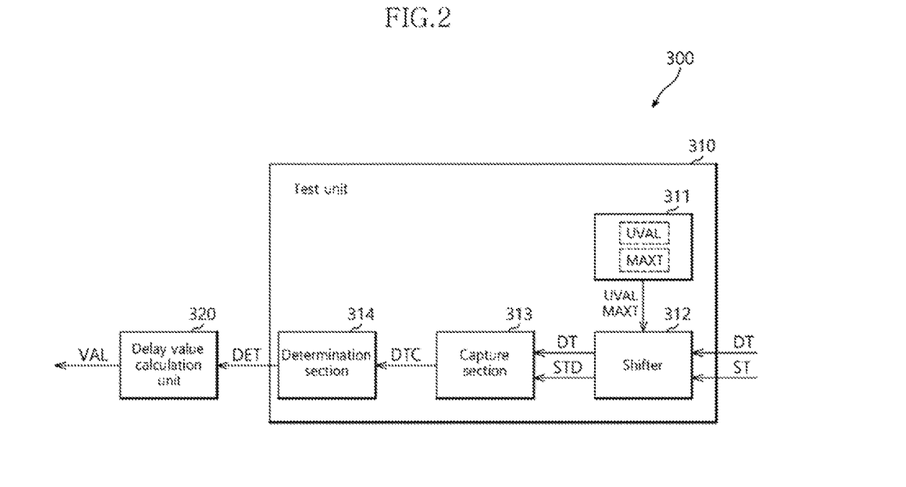
FIG. 2 is a block diagram illustrating an exemplary configuration of the calibration block shown in FIG. 1.

FIG. 2 is a block diagram illustrating an exemplary configuration of the calibration block 300 shown in FIG. 1.

The calibration block 300 may include a test unit 310 and a delay value calculation unit 320.

When the calibration operation is performed, the test unit 310 may receive the data DT and the strobe signal ST from the nonvolatile memory device 200, capture the data DT by using the strobe signal ST delayed by each of test delay values, and determine whether the capture for each of the plurality the test delay values is a success or a failure. The test unit 310 may include a register 311, a shifter 312, a capture section 313, and a determination section 314.

The register 311 may store a unit delay value UVAL and a maximum test count MAXT.

The unit delay value UVAL may be a unit by which to delay the strobe signal ST. Different test delay values to be applied to the strobe signal ST may be determined depending on the unit delay value UVAL. That is to say, the test delay values may differ respectively by the unit delay value UVAL. A smaller unit delay value UVAL means that the calibration operation may be performed more finely.

The maximum test count MAXT may be a total count by which capture of the data DT is tested based on the different test delay values of the strobe signal ST. The maximum test count MAXT may be determined depending on a number that is obtained by dividing the cycle of the strobe signal ST by the unit delay value UVAL. For example, the maximum test count MAXT may be determined as a maximum integer that is smaller than the number that is obtained by dividing the cycle of the strobe signal ST by the unit delay value UVAL.

The shifter 312 may store the data DT and the strobe signal ST received from the nonvolatile memory device 200, and output the data DT and a delayed strobe signal STD by the maximum test count MAXT. The delayed strobe signal STD may be delayed with respect to the data DT based on each of the test delay values determined by the unit delay value UVAL. The operation method of the shifter 312 will be described in detail with reference to FIG. 3.

The capture section 313 may capture the data DT received from the shifter 312 by using the delayed strobe signal STD received from the shifter 312, and may output the captured data DTC to the determination section 314.

The determination section 314 may determine whether the capture is a success or a failure, based on the captured data DTC received from the capture section 313, and output a determination signal DET indicating a success or a failure result. The determination section 314 may determine whether capture is a success or a failure, by comparing the captured data DTC with the predetermined test data stored in the data buffer 220 of the nonvolatile memory device 200 for the calibration operation, and output the determination signal DET which indicates a success or a failure result.

The delay value calculation unit 320 may calculate a delay value VAL of the strobe signal ST based on the determination signal DET. In more detail, the delay value calculation unit 320 may store the success/failure result included in the determination signal DET for each of the test delay values, and calculate the middle value of test delay values for each of which capture is determined as a success, as the delay value VAL of the strobe signal ST.

Figure 3:
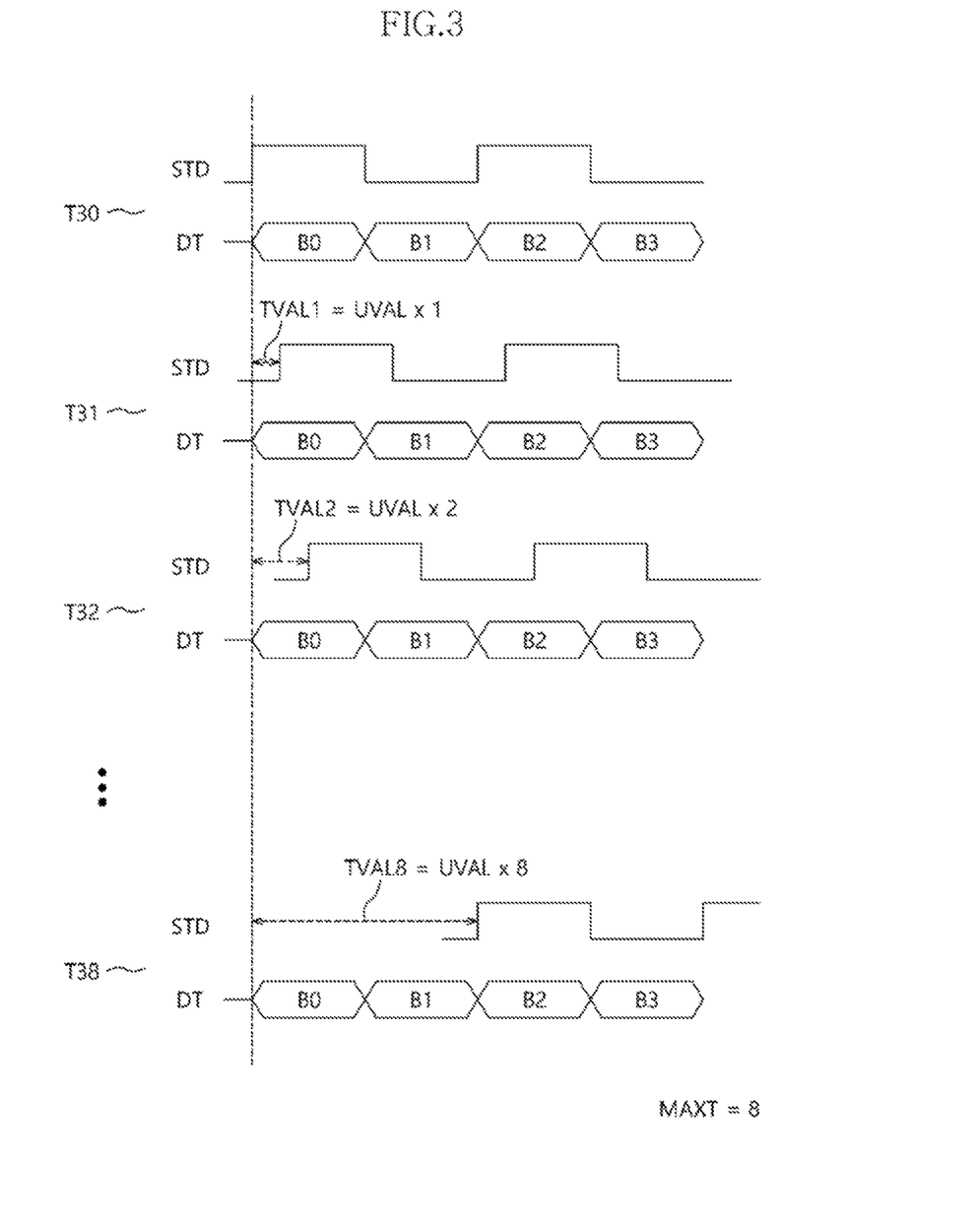
FIG. 3 is a timing diagram illustrating the data and delayed strobe signals outputted from a shifter employed in the calibration block of FIG. 2.

FIG. 3 is a timing diagram illustrating the data DT and delayed strobe signals STD outputted from the shifter 312 of FIG. 2. The data DT and the delayed strobe signals STD may be transmitted to the capture section 313.

Referring to FIG. 3, at a time T30, the shifter 312 may receive and store the data DT and the strobe signal ST from the nonvolatile memory device 200. Even at the time T30, the processing circuit 110 may receive the strobe signal ST by controlling the timing of the strobe signal ST depending on a preset delay value. However, since it is before the calibration operation is completed, the processing circuit 110 may receive the strobe signal ST by setting the delay value of the strobe signal ST to "0."

Then, at times T31 to T38, the shifter 312 may output the data DT and the delayed strobe signal STD by the maximum test count MAXT, based on the stored data DT and the stored strobe signal ST. At the times T31 to T38, test delay values TVAL1 to TVAL8 of the delayed strobe signal STD may be increased gradually by the unit delay value UVAL. For example, at the time T31, test delay value TVAL1 of the delayed strobe signal STD may be increased by the unit delay value UVAL. At the time T32, test delay value TVAL2 of the delayed strobe signal STD may be increased by the unit delay value UVAL×2. At the time T38, test delay value TVAL8 of the delayed strobe signal STD may be increased by the unit delay value UVAL×8. At the times T31 to T38, as will be described below with reference to FIG. 4, the capture section 313 may capture the data DT by using the delayed strobe signal STD, and the determination section 314 may receive the captured data DTC and output the determination signal DET by determining whether the capture is a success or a failure, based on the captured data DTC.

Figure 4:
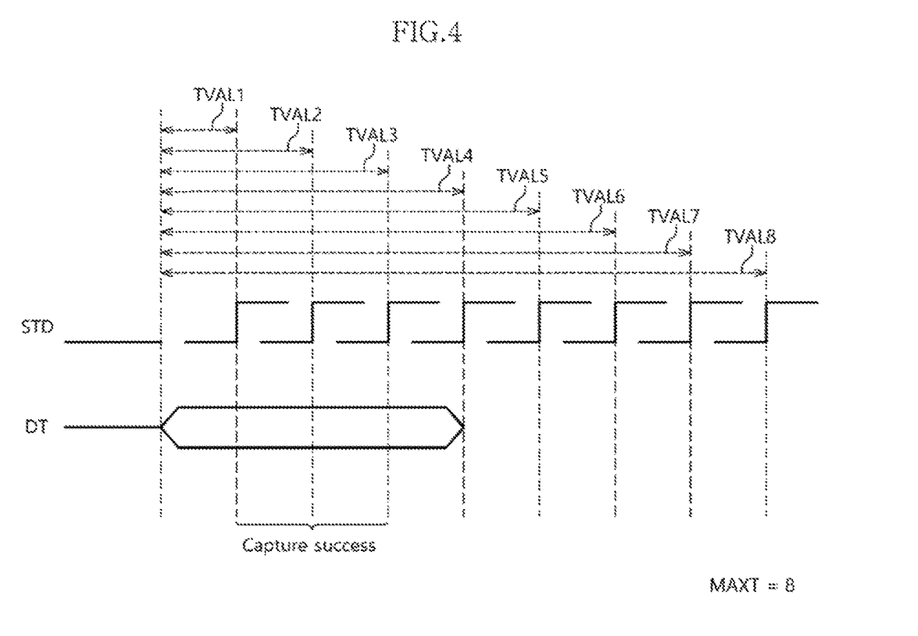
FIG. 4 is a diagram illustrating exemplary operations of a capture section, a determination section and a delay value calculation unit employed in the calibration block shown in FIG. 2.

FIG. 4 is a diagram illustrating the operations of the capture section 313, the determination section 314 and the delay value calculation unit 320 shown in FIG. 2. While the data DT is captured at the rising edge of the delayed strobe signal STD in FIG. 4, the data DT may be captured at the falling edge of the delayed strobe signal STD since the data DT is outputted from the nonvolatile memory device 200 in the DDR mode.

Referring to FIG. 4, the capture section 313 may receive the data DT and the delayed strobe signal STD received from the shifter 312, sequentially by the maximum test count MAXT. In the illustrated example of FIG. 4, the maximum test count is eight (8). Each time the data DT and the delayed strobe signal STD are received, the capture section 313 may capture the data DT at the rising edge of the delayed strobe signal STD.

The determination section 314 may determine that capture is a success, when the captured data matches the predetermined test data. For example, the data DT may be captured precisely by the delayed strobe signal STD to which each of the test delay values TVAL1 to TVAL3 is applied. In this case, the data DT may match the test data, and it may be determined that capture for each of the test delay values TVAL1 to TVAL3 is a success. However, the data DT may not be captured by the delayed strobe signal STD to which each of the test delay values TVAL4 to TVAL8 is applied. In this case, the data DT may not match the test data, and it may be determined that capture for each of the test delay values TVAL4 to TVAL8 is a failure.

The delay value calculation unit 320 may calculate the middle value TVAL2 of the test delay values TVAL1 to TVAL3 for each of which capture is determined as a success, as the delay value VAL of the strobe signal ST. Thereafter, when a read operation is performed for the nonvolatile memory device 200, the processing circuit 110 may capture precisely the data DT by controlling the timing of the strobe signal ST with the calculated delay value VAL.

Figure 5:
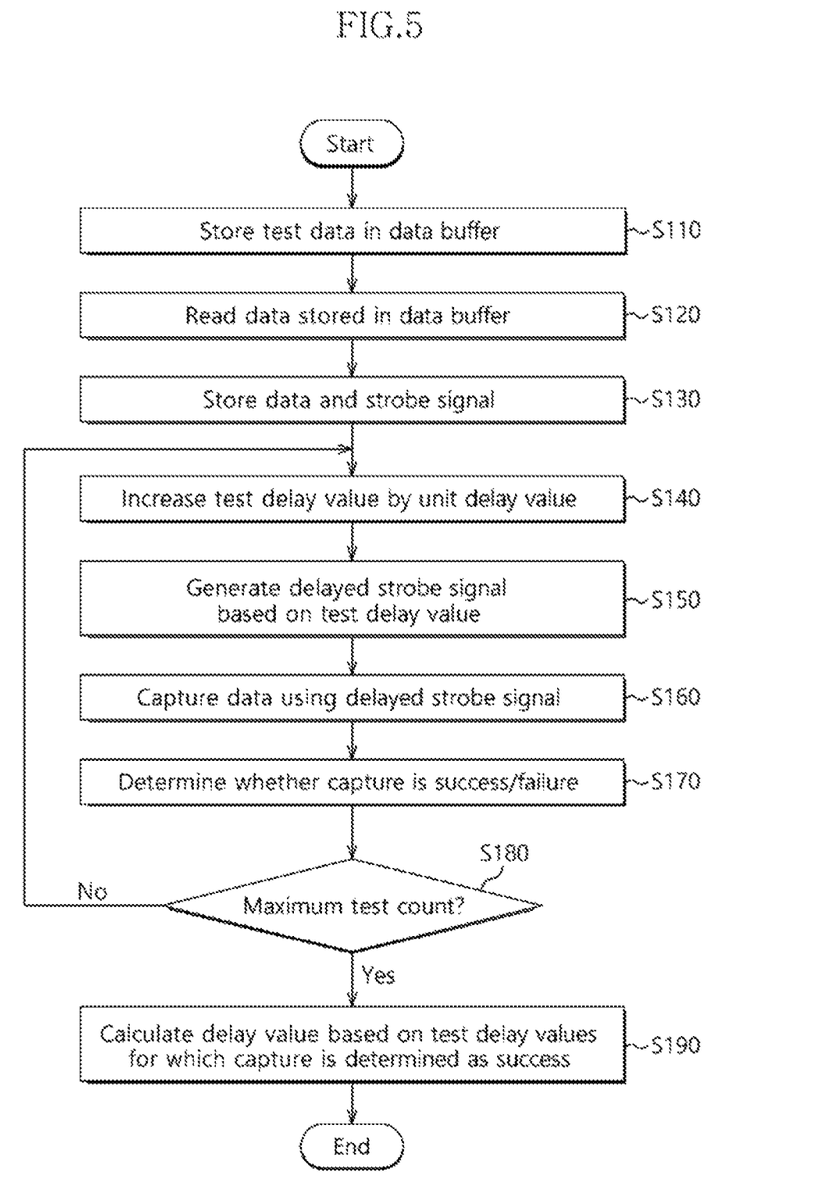
FIG. 5 is a flow chart illustrating a calibration operation method of the data storage device of FIG. 1, in accordance with an embodiment of the present invention.

FIG. 5 is a flow chart illustrating a calibration operation method of the data storage device 10 of FIG. 1.

At step S110, the calibration block 300 may store predetermined test data in the data buffer 220 of the nonvolatile memory device 200.

At step S120, the calibration block 300 may read the data DT stored in the data buffer 220. The nonvolatile memory device 200 may transmit the data DT to the controller 100 in synchronization with the strobe signal ST.

At step S130, the calibration block 300 may store the data DT and the strobe signal ST received from the nonvolatile memory device 200.

At step S140, the calibration block 300 may increase a test delay value by the unit delay value UVAL. When the calibration operation is started, the test delay value may be set to the unit delay value UVAL.

At step S150, the calibration block 300 may generate a delayed strobe signal STD based on the test delay value.

At step S160, the calibration block 300 may capture data by the delayed strobe signal STD.

At step S170, the calibration block 300 may determine whether capture is a success or a failure, by comparing the captured data DTC with the test data DT.

At step S180, the calibration block 300 may determine whether the test has been performed a number of times equal to the maximum test count MAXT. In other words, at step S180, the calibration block 300 may determine whether the maximum test count MAXT has been reached. When it is determined that the maximum test count MAXT has not been reached, the process may proceed to the step S140 for repeating the test in which the strobe signal ST is delayed based on a new test delay value increased by the unit delay value UVAL. Then steps S150 to S170 are being repeated for the increased test delay value. The loop of steps S140 to S180 may be repeated a number of times up to a maximum number equaling the maximum test count MAXT. When in step S180, it is determined that the test has been performed a number of times equal to the maximum test count MAXT, then the process may proceed to step S190.

At the step S190, the calibration block 300 may calculate the delay value VAL of the strobe signal ST based only on those test delay values for each of which capture was determined to be a success. When the capture is a success for more than one test delay values, then the calibration block 300 may calculate the middle value of the test delay values for each of which capture is determined as a success, as the delay value VAL of the strobe signal ST.

Figure 6:
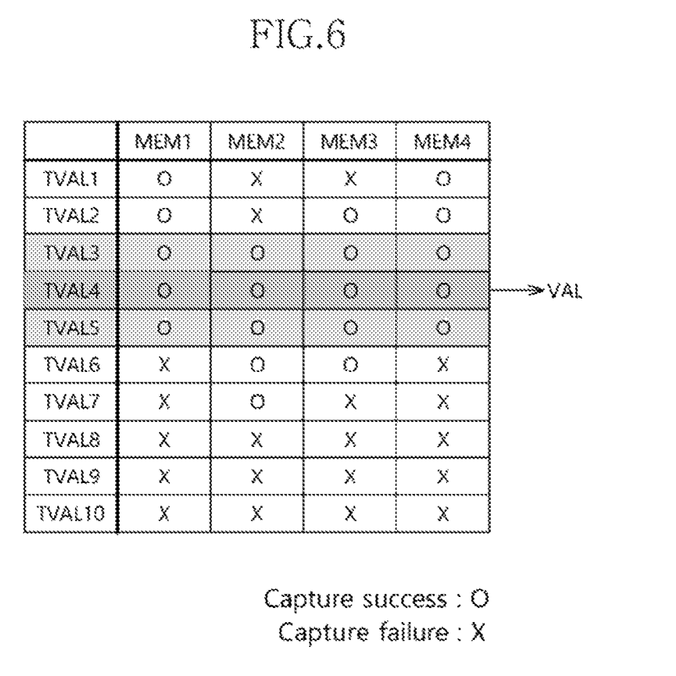
FIG. 6 is a diagram illustrating a method of the calibration block of FIG. 2 for performing a calibration operation for a plurality of nonvolatile memory devices in accordance with an embodiment of the present invention.

FIG. 6 is a diagram illustrating a method of the calibration block 300 of FIG. 2 for performing a calibration operation for a plurality of nonvolatile memory devices.

According to an embodiment, the data storage device 10 may include a plurality of nonvolatile memory devices each of which is constructed in substantially the same manner as the nonvolatile memory device 200 of FIG. 1. For example, the data storage device 10 may include 4 nonvolatile memory devices MEM1 to MEM4. In this case, the test unit 310 of FIG. 2 may delay the respective strobe signals received from the nonvolatile memory devices MEM1 to MEM4, based on each of 10 different test delay values TVAL1 to TVAL10. The test unit 310 may determine whether capture of the data received from each of the nonvolatile memory devices MEM1 to MEM4 by using the delayed strobe signals is a success or failure, for each of the test delay values TVAL1 to TVAL10. The delay value calculation unit 320 may calculate the middle value TVAL4 of test delay values TVAL3 to TVAL5 for each of which capture is determined as a success for all of the nonvolatile memory devices MEM1 to MEM4, as the delay value VAL of the strobe signals of the nonvolatile memory devices MEM1 to MEM4. Thereafter, the processing circuit 110 may capture precisely data by controlling the timing of the strobe signal with the delay value VAL calculated by the calibration block 300, for each of the nonvolatile memory devices MEM1 to MEM4. In other words, the delay value VAL calculated by the calibration block 300 may be applied in common to all the strobe signals received from the nonvolatile memory devices MEM1 to MEM4.

However, according to an embodiment, the calibration block 300 may calculate different delay values by performing a calibration operation for each of the nonvolatile memory devices MEM1 to MEM4 according to the above-described method.

Figure 7:
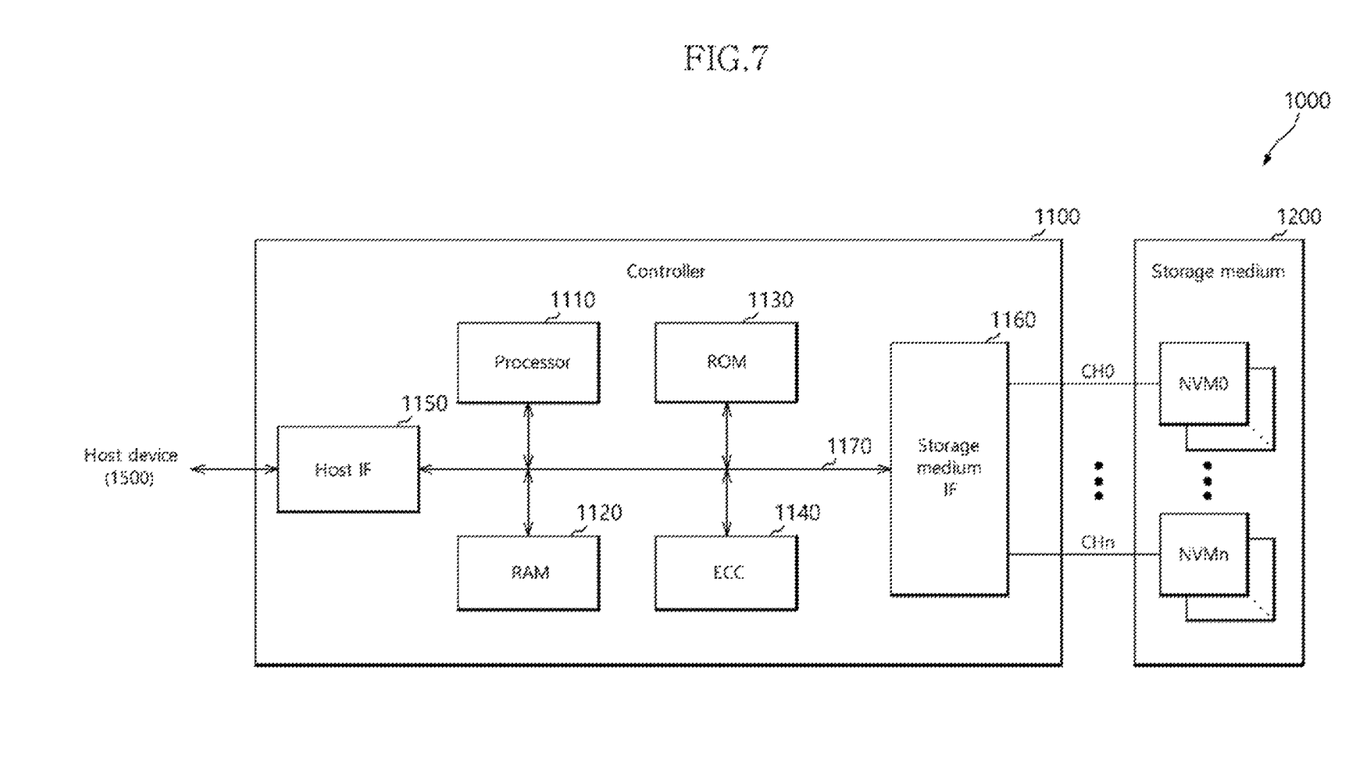
FIG. 7 is a block diagram illustrating a solid state drive (SSD) in accordance with an embodiment of the present invention.

FIG. 7 is a block diagram illustrating a solid state drive (SSD) 1000 in accordance with an embodiment.

The SSD 1000 may include a controller 1100 and a storage medium 1200 operatively coupled to one another via a plurality of channels CH0 to CHn.

The controller 1100 may control data exchange between a host device 1500 and the storage medium 1200. The controller 1100 may include a processor 1110, a random access memory (RAM) 1120, a read only memory (ROM) 1130, an error correction code (ECC) unit 1140, a host interface (IF) 1150 and a storage medium interface (IF) 1160 which are coupled through an internal bus 1170.

The controller 1100 may also include the processing circuit 110 including the calibration unit 300 of FIGS. 1 and 2 and may perform a calibration operation substantially similarly to the controller 100 as described in FIGS. 1 to 6. The controller 1100 may delay the strobe signals received from a plurality of nonvolatile memory devices NVM0 to NVMn, based on respective different test delay values. The controller 1100 may determine whether capture of data received from each of the nonvolatile memory devices NVM0 to NVMn by using each of delayed strobe signals is a success or a failure, for the respective test delay values. The controller 1100 may calculate the middle value of test delay values for each of which capture is determined as a success with regard to all of the nonvolatile memory devices NVM0 to NVMn, as the delay value of the strobe signals of the nonvolatile memory devices NVM0 to NVMn.

The processor 1110 may control general operations of the controller 1100. The processor 1110 may store data in the storage medium 1200 and read stored data from the storage medium 1200, according to data processing requests from the host device 1500. In order to efficiently manage the storage medium 1200, the processor 1110 may control internal operations of the SSD 1000 such as a merge operation, a wear leveling operation, and so forth.

The RAM 1120 may store programs and program data to be used by the processor 1110. The RAM 1120 may temporarily store data received from the host interface 1150 before transferring it to the storage medium 1200, and may temporarily store data received from the storage medium 1200 before transferring it to the host device 1500.

The ROM 1130 may store program codes to be read by the processor 1110. The program codes may include commands to be processed by the processor 1110, for the processor 1110 to control the internal units of the controller 1100.

The ECC unit 1140 may encode data to be stored in the storage medium 1200, and may decode data read from the storage medium 1200. The ECC unit 1140 may detect and correct an error occurred in data, according to an ECC algorithm.

The host interface 1150 may exchange data processing requests, data, etc. with the host device 1500.

The storage medium interface 1160 may transmit control signals and data to the storage medium 1200. The storage medium interface 1160 may receive data from the storage medium 1200. The storage medium interface 1160 may be coupled with the storage medium 1200 through a plurality of channels CH0 to CHn.

The storage medium 1200 may include the plurality of nonvolatile memory devices NVM0 to NVMn. Each of the plurality of nonvolatile memory devices NVM0 to NVMn may perform a write operation and a read operation according to control of the controller 1100.

Figure 8:
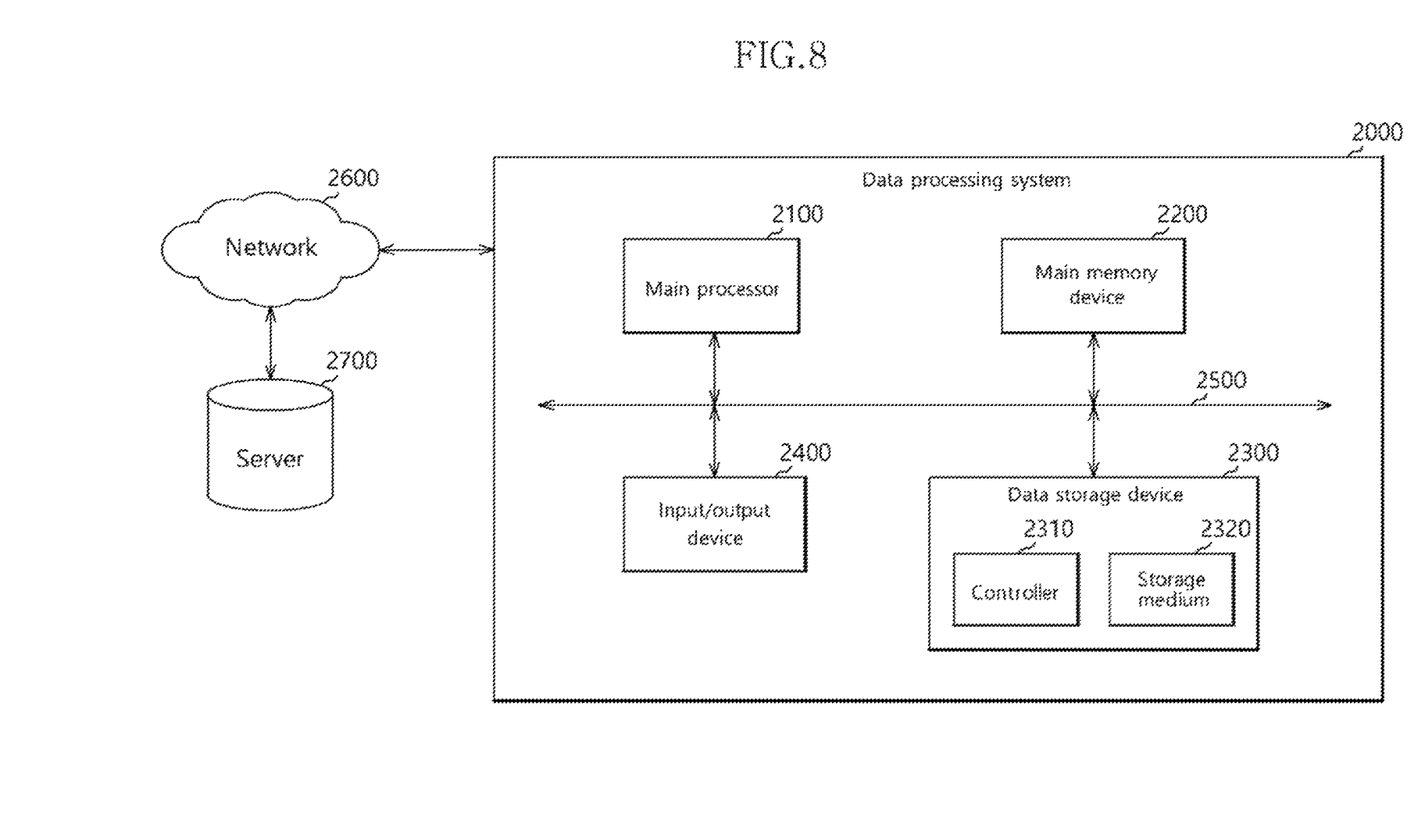
FIG. 8 is a block diagram illustrating a data processing system employing a data storage device in accordance with an embodiment of the present invention.

FIG. 8 is a block diagram illustrating a data processing system 2000 employing a data storage device 2300 in accordance with an embodiment of the present invention.

The data processing system 2000 may be any suitable electronic device including, for example, a computer, a laptop, a netbook, a smart phone, a digital television (TV), a digital camera, a navigator, and the like. The data processing system 2000 may include a main processor 2100, a main memory device 2200, a data storage device 2300, and an input/output device 2400. The internal units of the data processing system 2000 may exchange data, control signals, etc. through a system bus 2500.

The main processor 2100 may control general operations of the data processing system 2000. The main processor 2100 may be a central processing unit, for example, such as a microprocessor. The main processor 2100 may execute softwares such as an operation system, an application, a device driver, and so forth, on the main memory device 2200.

The main memory device 2200 may store programs and program data to be used by the main processor 2100. The main memory device 2200 may temporarily store data to be transmitted to the data storage device 2300 and the input/output device 2400.

The data storage device 2300 may include a controller 2310 and a storage medium 2320. The data storage device 2300 may be configured and operate substantially similarly to the data storage device 10 of FIG. 1. Hence, the controller 2310 may include the processing unit 110 including the calibration block 300 and may perform a calibration operation substantially similarly to the controller 100 as described in FIGS. 1 to 6.

The input/output device 2400 may include a keyboard, a scanner, a touch screen, a screen monitor, a printer, a mouse, or the like, capable of exchanging data with a user, such as receiving a command for controlling the data processing system 2000 from the user or providing a processed result to the user.

According to an embodiment, the data processing system 2000 may communicate with at least one server 2700 through a network 2600 such as a local area network (LAN), a wide area network (WAN), a wireless network, and so on. The data processing system 2000 may include a network interface (not shown) to access the network 2600.

While various embodiments have been described above, it will be understood to those skilled in the art that the embodiments described are only examples of the present invention and are not intended to limit the scope of the present invention. Accordingly, the data storage device and the operating method thereof described herein should not be limited based on the described embodiments.

What is claimed is:

1. A data storage device comprising:
    a memory device suitable for storing and outputting data in synchronization with a strobe signal; and
    a controller suitable for storing the data and the strobe signal received from the memory device as stored data and a stored strobe signal, generating a delayed strobe signal by delaying the stored strobe signal based on each of different test delay values which are calculated based on a unit delay value and a maximum test count, testing capture of the stored data by using the delayed strobe signal, and determining a delay value of the strobe signal based on a test result.

2. The data storage device according to claim 1, wherein the controller comprises:
    a test unit suitable for determining whether the capture is a success or a failure, for each of the test delay values; and
    a delay value calculation unit suitable for calculating the delay value, based on test delay values for each of which the capture is determined as a success.

3. The data storage device according to claim 2, wherein the test unit comprises:
    a shifter suitable for storing the data and the strobe signal received from the memory device, and outputting the stored data and the delayed strobe signal based on each of the test delay values;
    a capture section suitable for capturing the stored data by using the delayed strobe signal, and outputting captured data; and
    a determination section suitable for determining whether the capture is a success or a failure, by comparing the captured data with test data.

4. The data storage device according to claim 3,
    wherein two adjacent test delay values among the test delay values differ by a unit delay value, and
    wherein the shifter outputs the stored data and the delayed strobe signal a plurality of times up to a maximum test count determined by the unit delay value and a cycle of the strobe signal.

5. The data storage device according to claim 2, wherein the delay value calculation unit calculates a middle value of the test delay values for each of which the capture is determined as a success, as the delay value.

6. The data storage device according to claim 2, further comprising:
    one or more other memory devices suitable for outputting data in synchronization with a strobe signal,
    wherein the test unit determines whether capture of data received from each of the other memory devices is a success or a failure, for each of the test delay values, and
    wherein the delay value calculation unit calculates a middle value of test delay values for each of which the capture is determined as a success for all the other memory devices and the memory device, as the delay value.

7. The data storage device according to claim 1,
wherein the memory device comprises a data buffer which is volatile, and
wherein the controller stores test data in the data buffer, and reads the test data stored in the data buffer, as the data.

8. The data storage device according to claim 7, wherein the controller stores the test data in the data buffer in a single data rate (SDR) mode, and reads the test data from the data buffer in a double data rate (DDR) mode.

9. A method for operating a data storage device, comprising:
storing data and a strobe signal received from a memory device as stored data and a stored strobe signal;
generating a delayed strobe signal by delaying the stored strobe signal based on each of different test delay values which are calculated based on a unit delay value and a maximum test count;
testing capture of the stored data by using the delayed strobe signal; and
determining a delay value of the strobe signal based on a test result.

10. The method according to claim 9, wherein the testing of the capture comprises:
determining whether the capture is a success or a failure, by comparing data captured by using the delayed strobe signal with test data.

11. The method according to claim 9, wherein the determining of the delay value comprises:
calculating a middle value of test delay values for each of which the capture is determined as a success, as the delay value.

12. The method according to claim 9, wherein two adjacent test delay values among the test delay values differ by a unit delay value, and the number of the test delay values is determined by the unit delay value and a cycle of the strobe signal.

13. The method according to claim 9, further comprising:
storing test data in a data buffer of the memory device which is volatile; and
reading the test data stored in the data buffer, as the data.

14. The method according to claim 13, wherein the test data is stored in the data buffer in a single data rate (SDR) mode, and is read from the data buffer in a double data rate (DDR) mode.

15. A controller for a data storage device comprising:
a test unit suitable for receiving data in synchronization with a strobe signal from a memory device, storing the data and the strobe signal received from the memory device as stored data and a stored strobe signal, generating a delayed strobe signal by delaying the stored strobe signal based on each of different test delay values which are calculated based on a unit delay value and a maximum test count, and testing capture of the stored data by using the delayed strobe signal; and
a delay value calculator suitable for determining a delay value of the strobe signal based on a test result.

16. The controller according to claim 15, wherein the test unit is suitable for determining whether the capture is a success or a failure, for each of the test delay values, and
the delay value calculator is suitable for calculating the delay value, based on test delay values for each of which the capture is determined as a success.

17. The controller according to claim 16, wherein the test unit comprises:
a shifter suitable for storing the data and the strobe signal received from the memory device, and outputting the stored data and the delayed strobe signal based on each of the test delay values;
a capture section suitable for capturing the stored data by using the delayed strobe signal, and outputting captured data; and
a determination section suitable for determining whether the capture is a success or a failure, by comparing the captured data with test data.

18. The controller according to claim 17,
wherein two adjacent test delay values among the test delay values differ by a unit delay value, and
wherein the shifter outputs the stored data and the delayed strobe signal a plurality of times up to a maximum test count determined by the unit delay value and a cycle of the strobe signal.

19. The controller according to claim 16, wherein the delay value calculator calculates a middle value of the test delay values for each of which the capture is determined as a success, as the delay value.

20. The controller according to claim 15, wherein the controller stores test data in a data buffer of the memory device, and reads the test data stored in the data buffer, as the data.

* * * * *